(12) United States Patent
Fukuda et al.

(10) Patent No.: US 7,534,981 B2
(45) Date of Patent: May 19, 2009

(54) OPTICAL SEMICONDUCTOR DEVICE HAVING A SHIELD WIRE AND OPTICAL PICKUP DEVICE HAVING A SHIELD WIRE

(75) Inventors: Hideo Fukuda, Kyoto (JP); Shinichi Miyamoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 21 days.

(21) Appl. No.: 11/762,192

(22) Filed: Jun. 13, 2007

(65) Prior Publication Data
US 2008/0054162 A1    Mar. 6, 2008

(30) Foreign Application Priority Data
Aug. 30, 2006    (JP)    ............... 2006-234456

(51) Int. Cl.
G02B 7/04    (2006.01)
H01J 40/14    (2006.01)
H03F 3/08    (2006.01)

(52) U.S. Cl. ............................... 250/201.5; 250/214 R; 250/214 A

(58) Field of Classification Search ............. 250/214 R, 250/214.1, 214 A, 214 AG, 201.5; 369/128, 369/134
See application file for complete search history.

(56) References Cited

U.S. PATENT DOCUMENTS

| | | | | |
|---|---|---|---|---|
| 4,535,233 A | * | 8/1985 | Abraham | ................. 250/214 A |
| 4,749,852 A | * | 6/1988 | Takahashi | ............... 250/214 A |
| 4,972,400 A | * | 11/1990 | Kuwabara et al. | ........ 369/44.29 |
| 2003/0111604 A1 | * | 6/2003 | Quek | ...................... 250/338.1 |
| 2003/0152015 A1 | * | 8/2003 | Kawamura | ............. 369/124.11 |
| 2007/0075222 A1 | | 4/2007 | Fukuda et al. | .......... 250/214 A |
| 2007/0075223 A1 | | 4/2007 | Murao et al. | ............ 250/214 A |
| 2007/0108374 A1 | | 5/2007 | Fukuda et al. | .......... 250/214 A |

FOREIGN PATENT DOCUMENTS

JP    3103175    8/2000

OTHER PUBLICATIONS

English language Abstract of JP 5-167357.

* cited by examiner

*Primary Examiner*—Que T Le
*Assistant Examiner*—Pascal M Bui-Pho
(74) *Attorney, Agent, or Firm*—Greenblum & Bernstein, P.L.C.

(57) ABSTRACT

An optical semiconductor device of the present invention includes: a light-receiving element which converts light into an electric signal; an amplifier circuit having an input terminal to which the light-receiving element is connected, and which amplifies the electric signal; a connection wire to which the signal amplified by the amplifier circuit is outputted; an output circuit having an input terminal to which the connection wire is connected, and which performs current amplification on the signal amplified by the amplifier circuit and outputs the current-amplified signal to an output terminal; a feedback resistor connected between the input of the amplifier circuit and the output terminal; and a shield wire connected to a potential outputted from the output circuit or a potential resulting from a voltage follower of the potential outputted from the output circuit, and which shields the connection wire from noise.

6 Claims, 10 Drawing Sheets

OPTICAL SEMICONDUCTOR DEVICE HAVING A SHIELD WIRE AND OPTICAL PICKUP DEVICE HAVING A SHIELD WIRE

BACKGROUND OF THE INVENTION (1) Field of the Invention

The present invention relates to an optical semiconductor device and an optical pickup device, and more particularly, to an optical semiconductor device which converts light into an electric signal and outputs the electric signal.

(2) Description of the Related Art

In recent years, the increase in the size of circuits is progressing with the increase in integration, function and speed of semiconductor integrated circuit devices. Accordingly, wirings become longer, and frequency characteristic deterioration due to the parasitic capacitance of the wirings is becoming a problem.

An optical pickup device includes a laser generator which irradiates an optical disk medium with a laser light used for each of a CD (Compact Disk) and a DVD (Digital Versatile Disc), and an optical semiconductor device which receives and amplifies the reflected light. The optical semiconductor device includes plural light-receiving elements which convert the received light into a photo-electric current, and an amplifier with several channels, which converts the photo-electric current received from the light-receiving elements into voltage.

As a light source, an infrared laser is used for the CD and a red laser is used for the DVD. Recently, a dual wavelength laser generator which monolithically generates the infrared laser and the red laser has become widespread. Positions for emitting the respective lasers having different wavelengths are provided at a predetermined interval in the dual wavelength laser generator, so that there exist two types of optical axis. Thus, the optical semiconductor device which receives the reflected light from the optical disk medium must have specific light-receiving elements and the amplifier circuits to accept the respective wavelengths. Consequently, the number of channels in the amplifier provided on one semiconductor substrate increases.

To cope with the deterioration of the frequency characteristic in the optical semiconductor device, a method of forming a shield wire for wiring which connects the light-receiving element and an input of the amplifier is well known (refer to Patent Document 1, for example).

The shield wire in the optical semiconductor device according to Patent Document 1 is described below. FIG. 1 is a diagram showing a configuration of the conventional optical semiconductor device according to Patent Document 1. The optical semiconductor device shown in FIG. 1 includes a light-receiving element 51 which is placed in a metal case 54, a semiconductor integrated circuit 63 which is formed on a print board 64, and inner leads 56 and 57. The light-receiving element 51 converts a light signal into a photo-electric current. The semiconductor integrated circuit 63 converts the photo-electric current which is received from the light-receiving element 51 into a voltage. The semiconductor integrated circuit 63 includes an amplifier 52 and a voltage follower 53. The amplifier 52 converts the photo-electric current which is received from the light-receiving element 51 into a voltage. The voltage follower 53 buffers a potential of a node 62 (an input wire 60 of the amplifier 52) and then outputs the potential to the node 61. The inner lead 57 connects a connection wire 55 of the light-receiving element 51 and an input wire 60 of the amplifier 52 through a terminal 58. The inner lead 56 is connected to the node 61 through a terminal 59 and is placed on both sides and a downside of the inner lead 57 (the downside is not shown). The inner lead 56 is positioned to eliminate a parasitic capacitance, which is generated in the inner lead 57, with the print board and to generate a parasitic capacitance with the inner lead 56. A potential of the inner lead 56 is equal to that of the inner lead 57, so that even when a parasitic capacitance is generated, the inner leads 56 and 57 operate in phase with an alternating current signal, and thus the deterioration of the frequency characteristic which is caused by the parasitic capacitance for the inner lead 57 is prevented.

Patent Document 1: Japanese Patent Publication No. 3103175.

SUMMARY OF THE INVENTION

However, the conventional optical semiconductor device described above has the following problem.

The wiring (the inner lead 57) which connects the light-receiving element 51 and the input of the amplifier 52 transmits a current signal, thus the parasitic capacitance of the wiring has a low influence on the wiring, although there is a voltage amplitude due to some voltage drop. In contrast, an output stage of the amplifier 52, in which the current signal is converted into a voltage signal by a feedback resistor of the amplifier 52, is susceptible to the influence of parasitic capacitance of the wiring by reason that the voltage widely changes. The output stage has a large current capacity and a low transfer impedance, so that the parasitic capacitance of the wiring has a low influence on the output stage, however, the wiring in the amplifier, more particularly, the connection wire of a differential amplifier passes only a small amount of current and has apparently a high transfer impedance, so that when the voltage amplitude which is equal to the amplitude of the converted voltage signal is transmitted, the connection wire is susceptible to the parasitic capacitance of the wiring, and deterioration in the frequency characteristic occurs.

Consequently, an object of the present invention is to provide an optical semiconductor device which reduces an influence of a parasitic capacitance and also prevents a deterioration of a frequency characteristic.

In order to achieve the aforementioned object, the optical semiconductor device according to the present invention includes: a light-receiving element which converts light into an electric signal; an amplifier circuit having an input to which the light-receiving element is connected, and which amplifies the electric signal; a connection wire to which the signal amplified by the amplifier circuit is outputted; an output circuit having an input to which the connection wire is connected, and which performs current amplification on the signal amplified by the amplifier circuit and outputs the current-amplified signal to an output terminal; a feedback resistor connected between the input of the amplifier circuit and the output terminal; and a shield wire connected to a potential outputted from the output circuit or a potential resulting from a voltage follower of the potential outputted from the output circuit, and which shields the connection wire from noise.

According to this configuration, the signal from the connection wire in the amplifier circuit is in phase with the signal from the shield wire, and the connection wire is thereby guarded. As a result, the alternating current component, which is generated between the connection wire and the shield wire, becomes zero, and the influence of the parasitic capacitance upon the connection wire in the amplifier circuit can be reduced. Thus, the deterioration of the frequency characteristic of the optical semiconductor device can be prevented.

Moreover, it is also possible that the amplifier circuit, the connection wire, and the output circuit are formed on a semiconductor substrate, and the shield wire is formed on a side of the connection wire facing the semiconductor substrate.

According to this configuration, the influence of the parasitic capacitance which is generated between the connection wire in the amplifier circuit and the semiconductor substrate can be reduced. Thus, the deterioration of the frequency characteristic of the optical semiconductor device can be prevented.

Moreover, it is also possible that, in the optical semiconductor device, the shield wire is formed on the side of the connection wire facing the semiconductor substrate, and at least one of a side and an upside of the connection wire when the side of the connection wire facing the semiconductor substrate is a downside.

According to this configuration, the influence of the parasitic capacitance which is generated between the other wire, which is adjacent to the connection wire in the amplifier circuit, and the connection wire can be reduced. Thus, the deterioration of the frequency characteristic of the optical semiconductor device can be further prevented.

Moreover, it is also possible that the shield wire is made of a metal layer, a polysilicon layer, or a diffusion layer, below the connection wire.

According to this configuration, it is possible to reduce the resistance value in the shield wire and improve a shielding effect by making the shield wire in the metal layer or the polysilicon layer. Moreover, the connection wire and the shield wire can be made with the small number of wiring layer by making the shield wire in the diffusion layer. Thus, the inexpensive optical semiconductor device can be easily obtained.

Moreover, it is also possible that the output circuit includes: a first output circuit which performs current amplification on the signal amplified by the amplifier circuit and outputs the current-amplified signal to the output terminal; and a second output circuit which performs current amplification on the signal amplified by the amplifier circuit and outputs the current-amplified signal to the shield wire, and the shield wire is connected to a potential outputted by the second output circuit and shields the connection wire from noise.

According to this configuration, the influence of the parasitic capacitance from the shield wire upon the output terminal can be eliminated.

Moreover, it is also possible that the amplifier circuit includes: a first transistor in which a control terminal is connected to the light-receiving element, and a first output terminal is connected to the connection wire; a second transistor in which a control terminal is connected to a reference voltage, and a second output terminal is connected to a second output terminal of the first transistor; a third transistor in which a control terminal is connected to a first output terminal of the second transistor, a first output terminal is connected to the connection wire, and a second output terminal is connected to a power supply voltage; a fourth transistor in which a control terminal and a first output terminal is connected to the first output terminal of the second transistor and a second output terminal is connected to a power supply voltage; and a first current source connected between the second output terminal of the first transistor and the second transistor and a ground.

Moreover, it is also possible that the amplifier circuit includes: a fifth transistor in which a control terminal is connected to the light-receiving element, a first output terminal is connected to the connection wire, and a second output terminal is connected to a ground; and a second current source connected between the connection wire and a power supply voltage.

Moreover, it is also possible that the output circuit includes: a sixth transistor in which a control terminal is connected to the connection wire, a first output terminal is connected to a power supply voltage, and a second output terminal is connected to the output terminal; and a third current source connected between the second output terminal of the sixth transistor and a ground.

Moreover, it is also possible that the amplifier circuit, the connection wire, and the output circuit are formed on a semiconductor substrate, and at least a part of the connection wire is positioned at an angle with respect to an edge of the semiconductor substrate, the angle excluding integral multiples of 45 degrees.

According to this configuration, the length of the connection wire which connects the output of the amplifier circuit and the input of the output circuit can be shortest. The area of the connection wire itself can thereby be smallest, and the parasitic capacitance of the connection wire can be minimized. Thus, the deterioration of the frequency characteristic of the optical semiconductor device can be prevented.

Moreover, the optical pickup device according to the present invention is an optical pickup device performing at least one of operations including reading of data from an optical disk medium and writing of data to an optical disk medium, and includes: a laser beam generating unit which irradiates the optical disk medium with a laser beam; and an optical semiconductor device which receives the laser beam radiated by the laser beam generating unit and reflected by the optical disk medium.

According to this configuration, the signal from the connection wire in the amplifier circuit is in phase with the signal from the shield wire, and the connection wire is thereby guarded. As a result, the alternating current component, which is generated between the connection wire and the shield wire, becomes zero, and the influence of the parasitic capacitance upon the connection wire in the amplifier circuit can be reduced. Thus, the deterioration of the frequency characteristic of the optical pickup device can be prevented.

The present invention can provide the optical semiconductor device which reduces the influence of the parasitic capacitance and also prevents the deterioration of the frequency characteristic.

FURTHER INFORMATION ABOUT TECHNICAL BACKGROUND TO THIS APPLICATION

The disclosure of Japanese Patent Application No. 2006-234456 filed on Aug. 30, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

The embodiments of the present invention are described below with reference to the drawings.

First Embodiment

An optical semiconductor device according to the first embodiment of the present invention shields a connection wire of a differential amplifier which makes up a current-voltage conversion amplifier, with a shield wire which is connected to an output of the current-voltage conversion amplifier. According to this configuration, the parasitic capacitance for the connection wire in the differential amplifier can be reduced, and the deterioration of the frequency characteristic can be prevented.

First, a configuration of the optical semiconductor device according to the first embodiment of the present invention is described.

Figure 1:
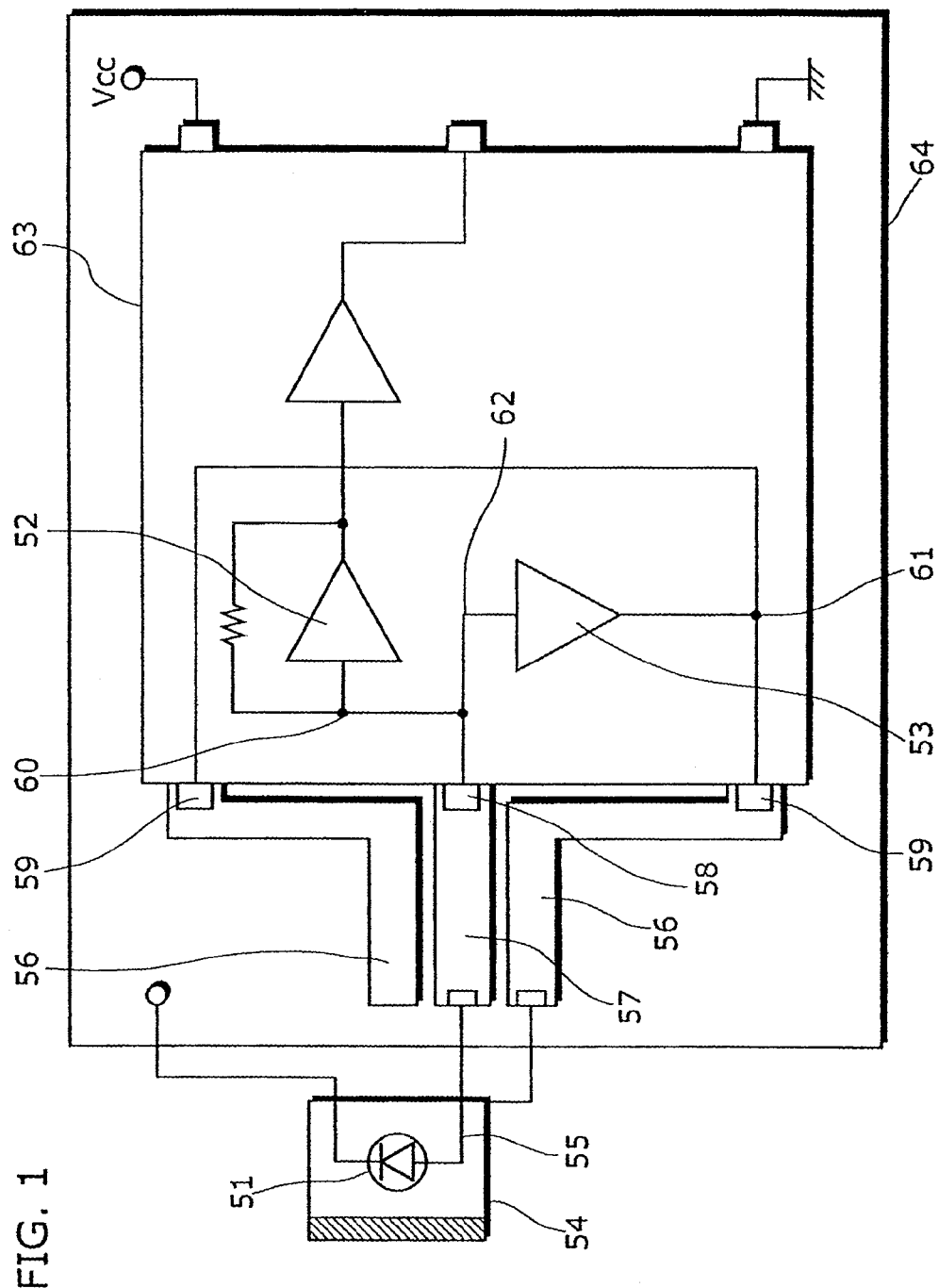
FIG. 1 is a diagram showing a configuration of a conventional optical semiconductor device.
Figure 2:
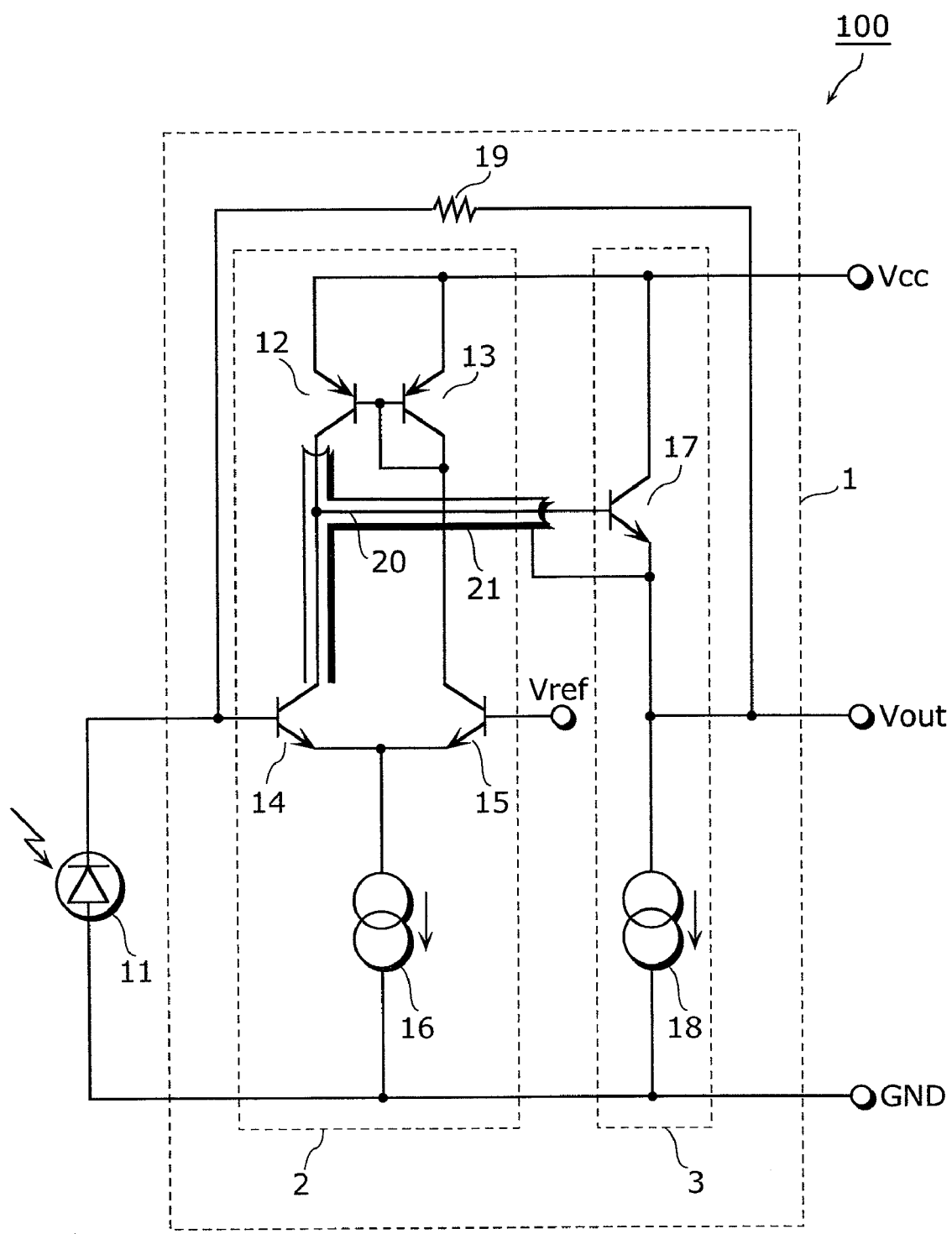
FIG. 2 is a diagram showing a configuration of an optical semiconductor device according to the first embodiment of the present invention.

FIG. 2 is a circuit diagram showing the configuration of the optical semiconductor device according to the first embodiment of the present invention.

An optical semiconductor device 100 shown in FIG. 2 includes a light-receiving element 11 and a current-voltage conversion amplifier 1. The light-receiving element 11 converts a radiated light signal into a current signal (photoelectric signal).

The current-voltage conversion amplifier 1 converts the current signal which is received from the light-receiving element 11 into a voltage signal and outputs the voltage signal to an output terminal Vout. The current-voltage conversion amplifier 1 includes a differential amplifier 2, an output stage 3, a feedback resistor 19, a connection wire 20, and a shield wire 21.

In the differential amplifier 2, the light-receiving element 11 is connected to an inverting input terminal, and a reference voltage Vref is connected to a non-inverting input terminal. The differential amplifier 2 outputs a differentially amplified signal to the connection wire 20. The differential amplifier 2 includes PNP transistors 12 and 13, NPN transistors 14 and 15, and a constant current source 16. In the NPN transistor 14, a base is connected to the light-receiving element 11, a collector is connected to the connection wire 20, and an emitter is connected to an emitter of the NPN transistor 15 and the constant current source 16. In the NPN transistor 15, a base is connected to the reference voltage Vref, a collector is connected to a base and a collector of the PNP transistor 13 and a base of the PNP transistor 12, and the emitter is connected to the emitter of the NPN transistor 14 and the constant current source 16. In the PNP transistor 12, the base is connected to the collector of the NPN transistor 15 and the base and the collector of the PNP transistor 13, the collector is connected to the connection wire 20, and an emitter is connected to a power supply voltage Vcc. In the PNP transistor 13, the base and the collector is connected to the collector of the NPN transistor 15 and the base of the PNP transistor 12, and an emitter is connected to the power supply voltage Vcc. The constant current source 16 is connected between the emitter of the NPN transistors 14 and 15 and a ground (GND).

The connection wire 20 is connected to an input of the output stage 3, and the output stage 3 carries out a current amplification on a signal, which is amplified by the differential amplifier 2, and outputs the amplified signal to the output terminal Vout. The output stage 3 includes a NPN transistor 17 and a constant current source 18. In the NPN transistor 17, a base is connected to the connection wire 20, a collector is connected to the power supply voltage Vcc, and an emitter is connected to the output terminal Vout. The constant current source 18 is connected between the emitter of the NPN transistor 17 and the GND.

The feedback resistor 19 is connected between the base of the NPN transistor 14, which is an inverting input terminal of the current-voltage conversion amplifier 1, and the output terminal Vout.

The connection wire 20 is the wire to connect an output of the differential amplifier 2 and the input of the output stage 3. In other words, the connection wire 20 is the wire to connect the collector of the NPN transistor 14, the collector of the PNP transistor 12, and the base of the NPN transistor 17.

The shield wire 21 is the wire which is connected to the emitter of the NPN transistor 17 (Vout) and is placed on a downside, both sides, and an upside of the connection wire 20. The shield wire 21 is the wire to shield the connection wire 20 from noise.

Figure 3:
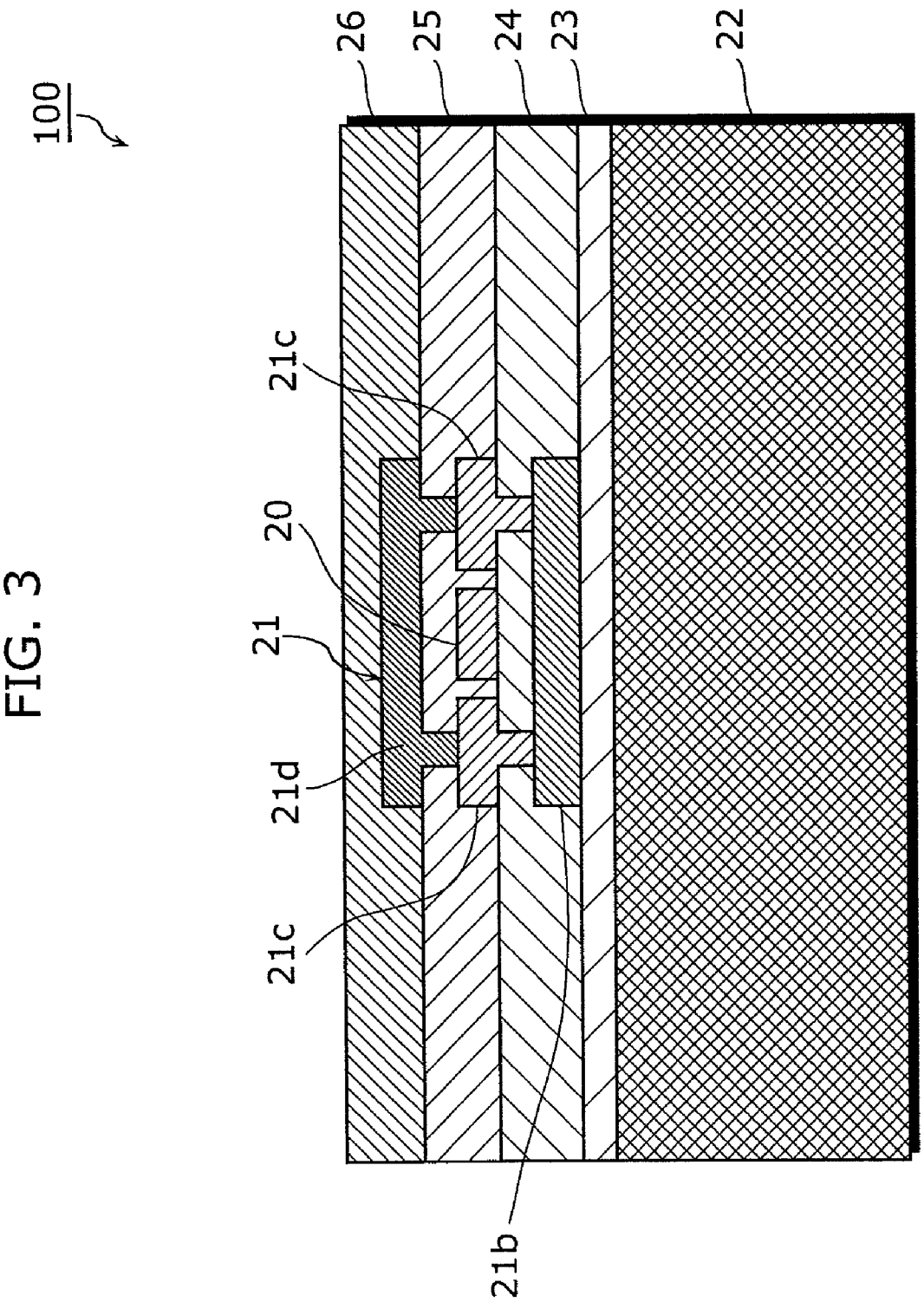
FIG. 3 is a diagram showing an example of a cross-sectional structure of the optical semiconductor device according to the first embodiment of the present invention.

FIG. 3 is a pattern diagram showing a cross-sectional structure of the connection wire 20 and the shield wire 21 in the optical semiconductor device 100. As shown in FIG. 3, the optical semiconductor device 100 includes the connection wire 20, the shield wire 21, a semiconductor substrate 22, and insulating layers 23 to 26. The connection wire 20 is made of a metal (Al, Cu, Au, or the like), for example. The shield wire 21 is formed to surround the connection wire 20. The shield wire 21 includes metal layers 21b, 21c, and 21d. The metal layer 21b is the shield wire which is placed below the connection wire 20, and is made of a metal (Al, Cu, Au, or the like), polysilicon, or the like, or example. The metal layer 21c is formed in the same layer as that of the connection wire 20, and is made of a metal (Al, Cu, Au, or the like), or example. The metal layer 21c is formed on both sides of the connection wire 20 so as to hold the connection wire 20. The metal layer 21d is formed above the connection wire 20 and is made of a metal (Al, Cu, Au, or the like), for example. Moreover, the metal layers 21b, 21c, and 21d are electrically connected to each other.

According to the configuration shown in FIG. 3, the connection wire 20 is surrounded by the shield wire 21, so that a parasitic capacitance between the connection wire 20 and the semiconductor substrate 22, as well as between other adjacent wiring, can be eliminated.

Figure 4:
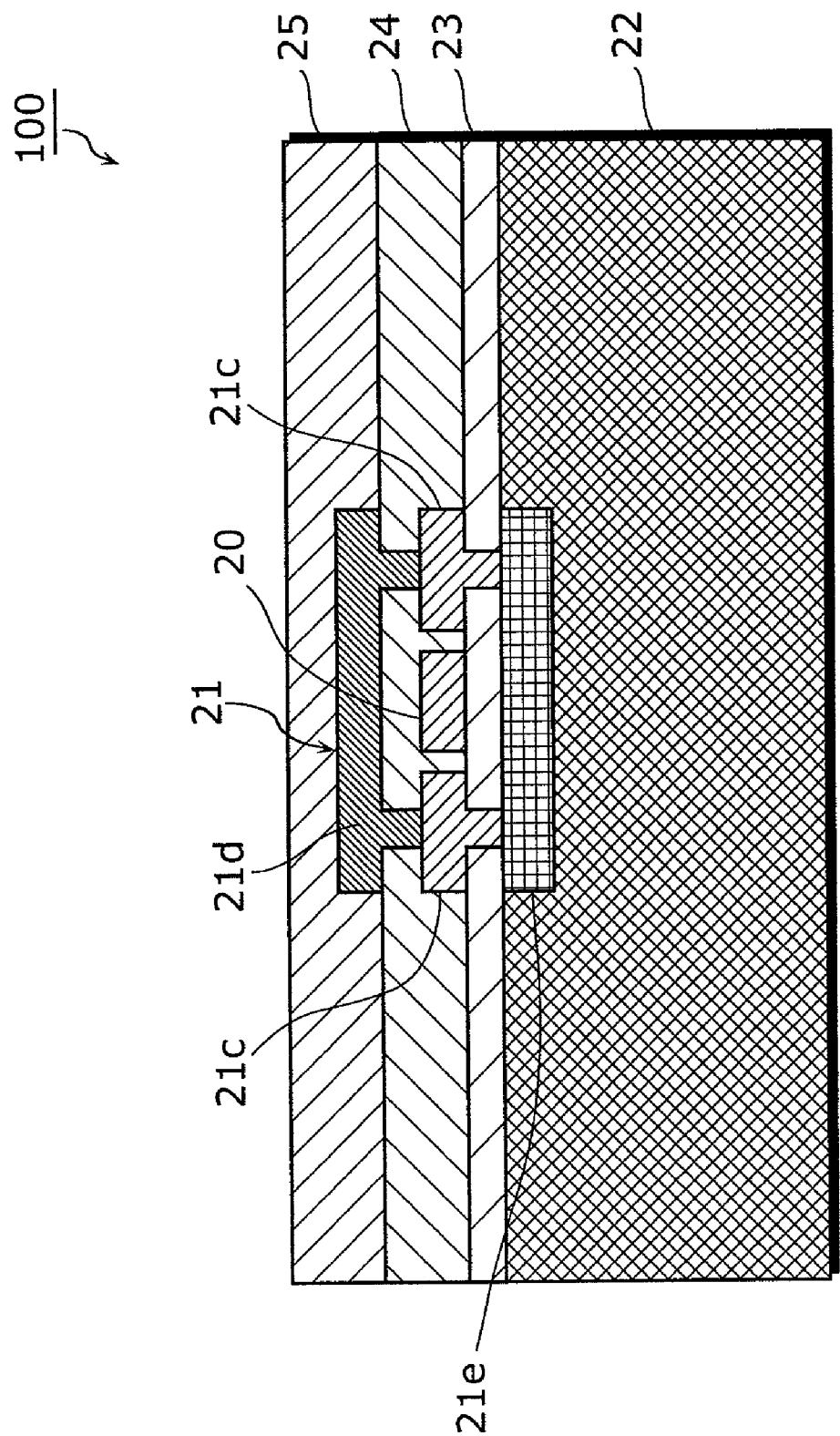
FIG. 4 is a diagram showing an example of a cross-sectional structure of the optical semiconductor device according to the first embodiment of the present invention.
Figure 5:
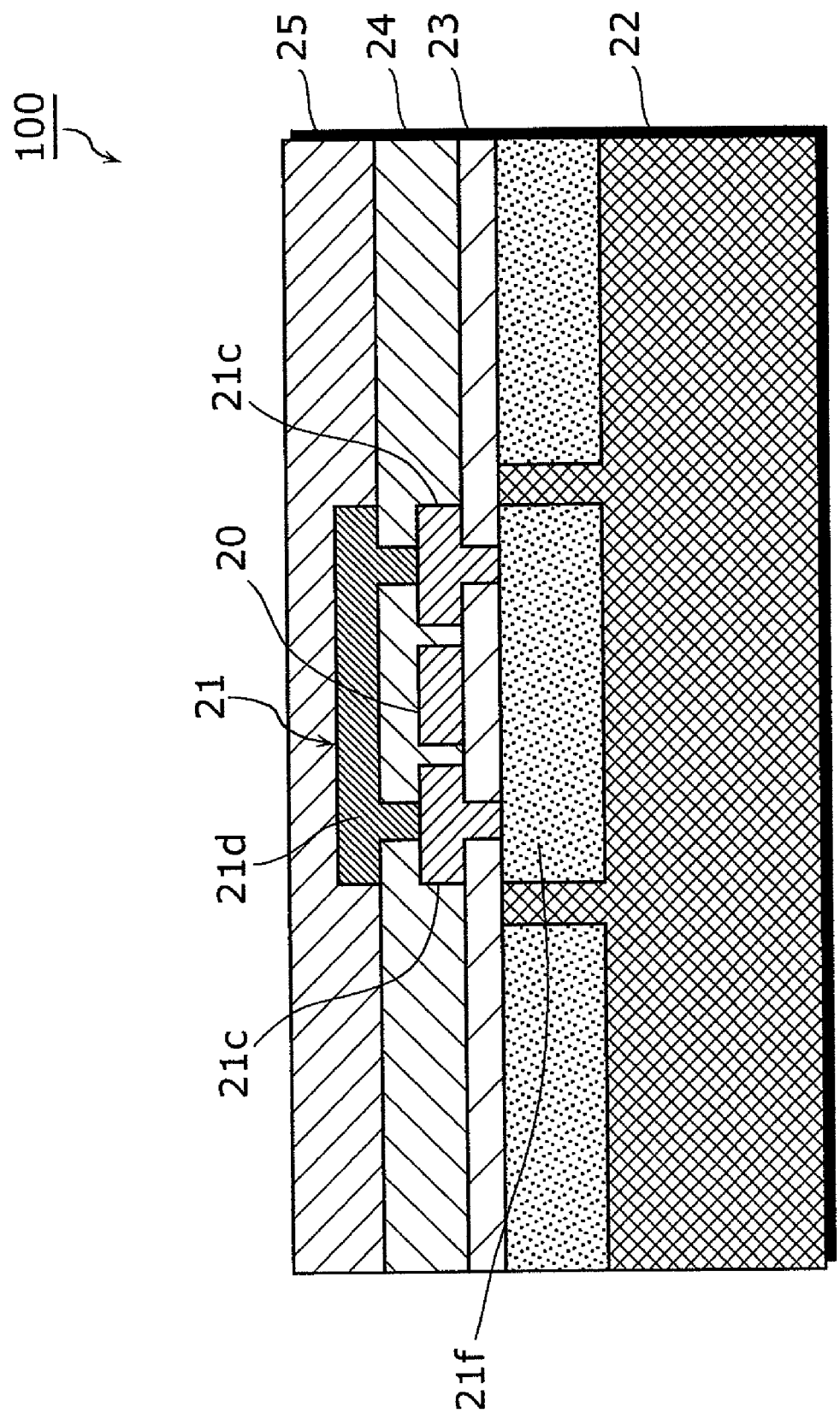
FIG. 5 is a diagram showing an example of a cross-sectional structure of the optical semiconductor device according to the first embodiment of the present invention.

Note that, as the cross-sectional structure of the shield wire 21, a diffusion layer or an epitaxial layer may be used instead of the metal layer 21b in the lower layer. FIGS. 4 and 5 are diagrams schematically showing the cross-sectional structure of the connection wire 20 and the shield wire 21, respectively, in a variation of the optical semiconductor device according to the present embodiment. As shown in FIG. 4, a shield wire 21e which is a diffusion layer can be formed as the shield wire 21 below the connection wire 20. Moreover, as shown in FIG. 5, a shield wire 21f which is an epitaxial layer separated from the other epitaxial layer can be formed as the shield wire 21 below the connection wire 20. When using the metal layer 21b as the shield wire 21 below the connection wire 20, three wiring layers are necessary to form the shield wire 21. In contrast, when using the diffusion layer 21e or the epitaxial layer 21f as the shield wire 21 below the connection wire 20, there is an advantage that the shield wire can be formed with two wiring layers. When using the metal layer 21b as shown in FIG. 3, a wiring resistance can be reduced compared to the case of using the diffusion layer 21e or the epitaxial layer 21f.

Next, an operation of the optical semiconductor device 100 is described.

When the light-receiving element 11 is irradiated with the light signal, the light-receiving element 11 converts the light signal into a current signal and the current signal is inputted to the base of the NPN transistor 14, which is the inverting input terminal of the differential amplifier 2, and the feedback resistor 19. The current signal is converted into a voltage signal by the feedback resistor 19 and is outputted to the emitter of the NPN transistor 17 in the output stage 3 and the output terminal Vout.

The collector of the NPN transistor 14 is the connection wire 20 of the differential amplifier 2 and is connected to the base of the NPN transistor 17 in the output stage 3. Thus, an output current of the differential amplifier 2 is a base current of the NPN transistor 17, and a value of the output current is 1/(1+hFE) times as large as that of an emitter current of the NPN transistor 17 (hFE indicates a current amplification factor here).

A fluctuation $\Delta$IPD of the photo-electric current when the light-receiving element 11 is irradiated with the light signal is provided from the emitter of the NPN transistor 17, thus a fluctuation of the base current of the NPN transistor 17, that is to say, a fluctuation $\Delta$Io of the output current of the differential amplifier 2 is expressed as:

$$\Delta Io = \Delta IPD/(1+hFE)$$

In other words, the fluctuation $\Delta$Io of the output current is extremely a small current fluctuation, thus an impedance of the connection wire 20 becomes large. Generally, a wire which has a large impedance is susceptible to the parasitic capacitance. Consequently, when the parasitic capacitance of the connection wire 20 of the differential amplifier 2 has the large parasitic capacitance, the deterioration of the frequency characteristic occurs.

Figure 6:
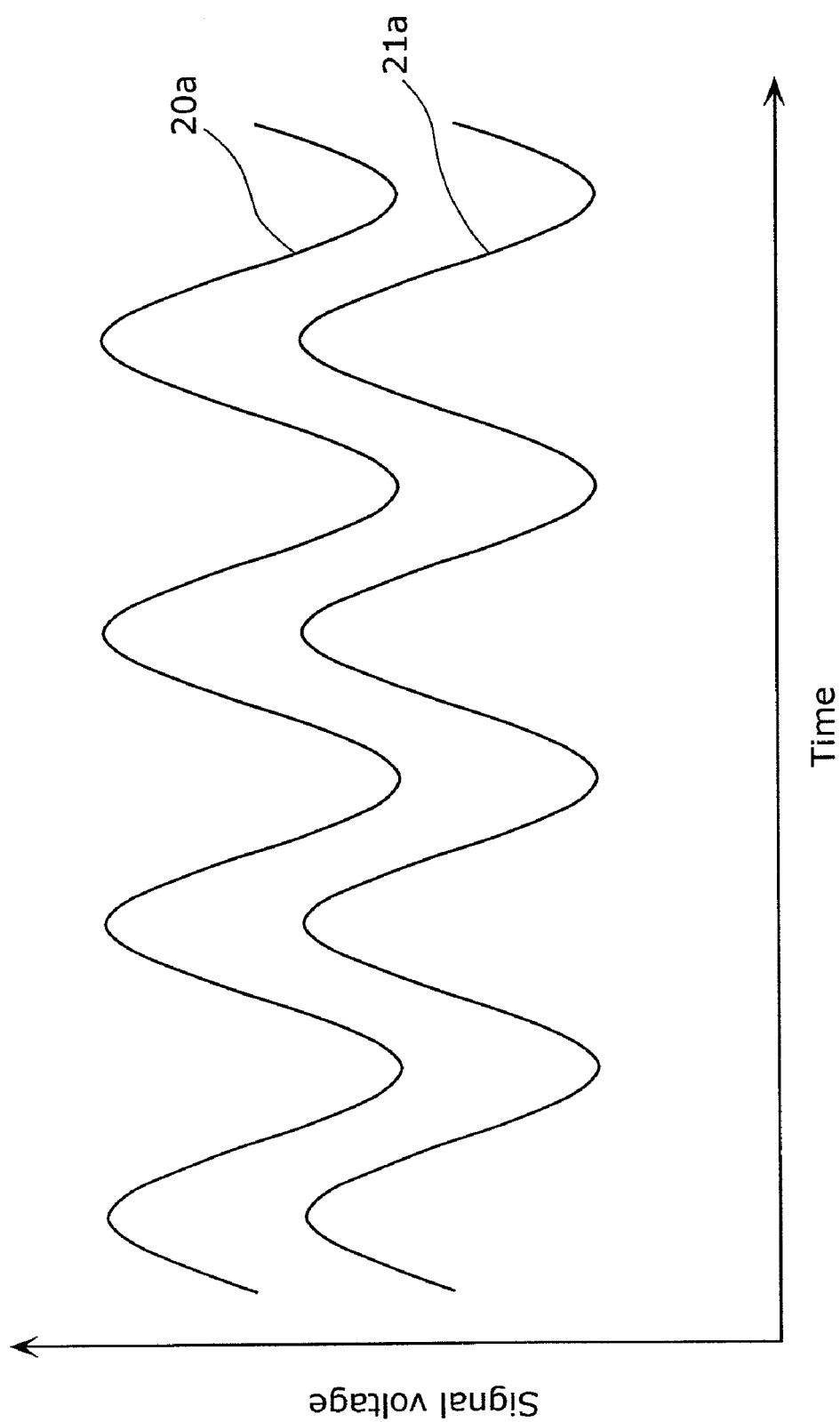
FIG. 6 is a diagram showing a signal voltage of a connection wire and a shield wire of the optical semiconductor device according to the first embodiment of the present invention.

FIG. 6 shows a base potential 20a (a potential of the connection wire 20) and an emitter potential 21a (a potential of the output terminal Vout and the shield wire 21) of the NPN transistor 17. As shown in FIG. 6, the base potential 20a and the emitter potential 21a of the NPN transistor 17 have in phase signals having a potential difference which is a base-emitter voltage VBE of the NPN transistor 17. Consequently, the parasitic capacitance between the connection wire 20 and the shield wire 21 in the differential amplifier is substantially negligible.

Next, a layout of the optical semiconductor device 100 according to the first embodiment of the present invention is described.

Figure 7:
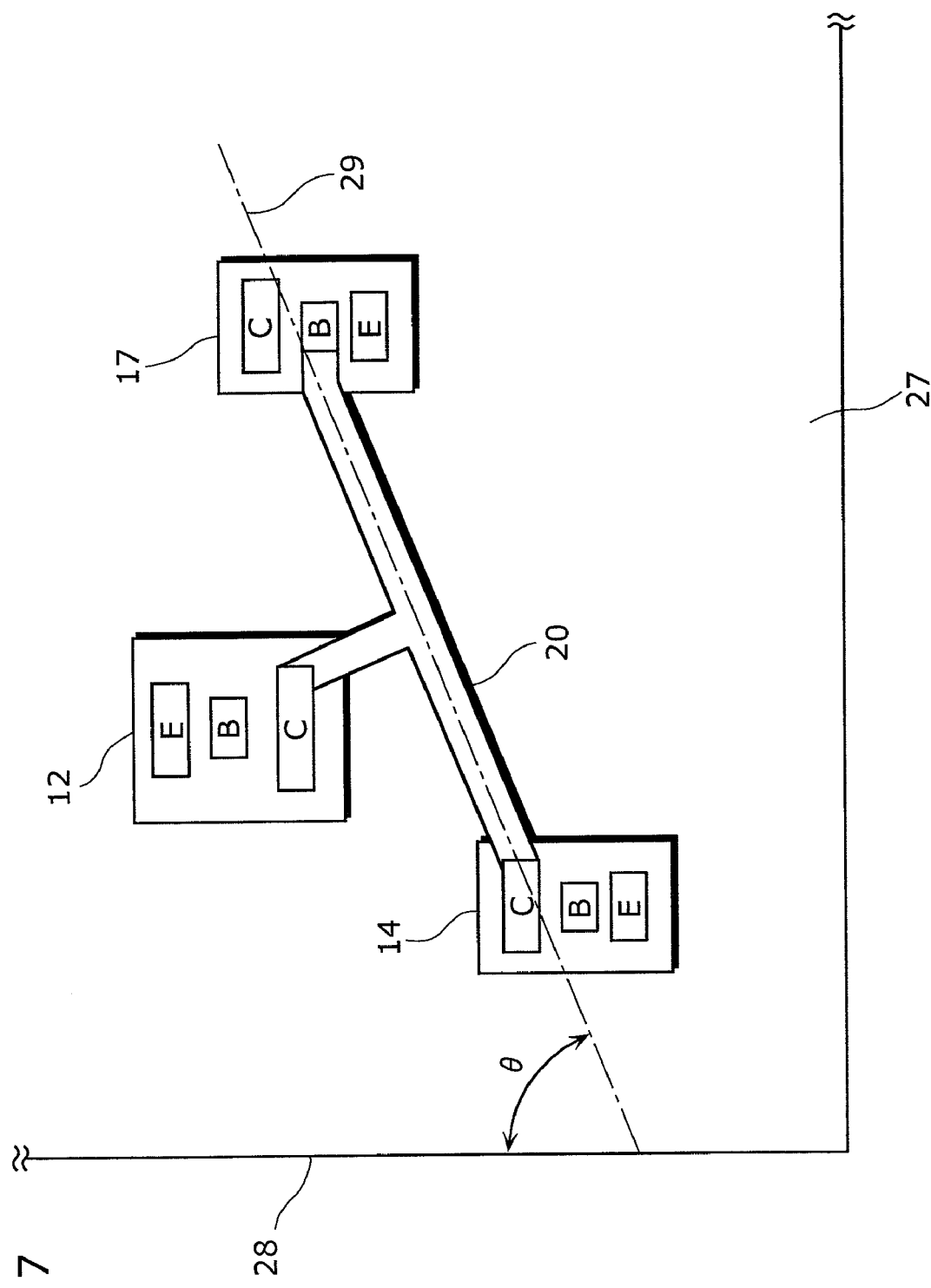
FIG. 7 is a diagram showing a layout placement of the connection wire of the optical semiconductor device according to the first embodiment of the present invention.

FIG. 7 is a diagram showing a layout example of the PNP transistor 12, the NPN transistors 14 and 17, and the connection wire 20 in a semiconductor chip 27 in which the optical semiconductor device 100 is formed.

As shown in FIG. 7, in the optical semiconductor device 100 according to the present embodiment, the connection wire 20 is arranged to make a length of the wire between the collector of the NPN transistor 14 and the base of the NPN transistor 17 shortest. The connection wire 20 is arranged to make a length of the wire which comes from the PNP transistor 12 to the wire between the collector of the NPN transistor 14 and the base of the NPN transistor 17 shortest. In other words, the connection wire 20 is positioned at an angle, excluding integral multiples of 45 degrees, with respect to a chip edge 28. In the conventional technique, the wire is positioned to be vertical to, to be horizontal to, or at the angle of ±45 degrees to the chip edge 28 of the semiconductor chip 27. Thus, as shown in FIG. 7, the length of the connection wire 20 can be shortened by positioning the connection wire 20 at the angle, excluding integral multiples of 45 degrees, with respect to the chip edge 28. In other words, an area of the connection wire 20 can be reduced. Consequently, the parasitic capacitance of the connection wire 20 can be reduced. Thus, the deterioration of the frequency characteristic of the optical semiconductor device 100 can be reduced.

As described above, the optical semiconductor device 100 according to the first embodiment has the shield wire 21b which is placed below the connection wire 20 of the differential amplifier 2 and also is connected to the output of the output stage 3. Thus, the parasitic capacitance between the semiconductor substrate 22 and the connection wire 20 can be reduced. Moreover, the optical semiconductor device 100 has the shield wire 21c which is formed on both sides of the connection wire 20 and also is connected to the output of the output stage 3. Thus, the parasitic capacitance between the other wire, which is lateral to the connection wire 20, and the connection wire 20 can be reduced. Furthermore, the optical semiconductor device 100 has the shield wire 21d which is formed on the upside of the connection wire 20 and also is connected to the output of the output stage 3. Thus, the parasitic capacitance between the wire, which is formed on the upside of the connection wire 20, and the connection wire 20 can be reduced. Consequently, the deterioration of the frequency characteristic of the optical semiconductor device 100 can be reduced.

Moreover, the length of the connection wire 20, that is to say, the area of the connection wire 20 can be reduced by positioning the connection wire 20 at the angle, excluding integral multiples of 45 degrees, with respect to the chip edge 28. Thus, the parasitic capacitance of the connection wire 20 can be reduced. Consequently, the deterioration of the frequency characteristic of the optical semiconductor device 100 can be reduced.

In the above description, the shield wire 21 is formed on the downside, the both sides, and the upside of the connection wire 20, however, it is also applicable to form the shield wire 21 on at least one of the areas, that is, the downside, the one side, the other side, and the upside of the connection wire 20, according to the situation of the wire to be positioned around the connection wire 20.

Moreover, the example of connecting the shield wire 21 and the output Vout in the output stage 3 is described above, however, it is also applicable to connect the shield wire 21 to a node whose potential is identical with the Vout or which is in phase with the Vout. For example, the shield wire 21 can be connected to a potential resulting from a voltage follower of the potential of the Vout. Moreover, it is also applicable to provide a circuit to buffer the signal from the connection wire 20 separately from the output stage 3 and then connect the buffered signal to the shield wire 21.

Figure 8:
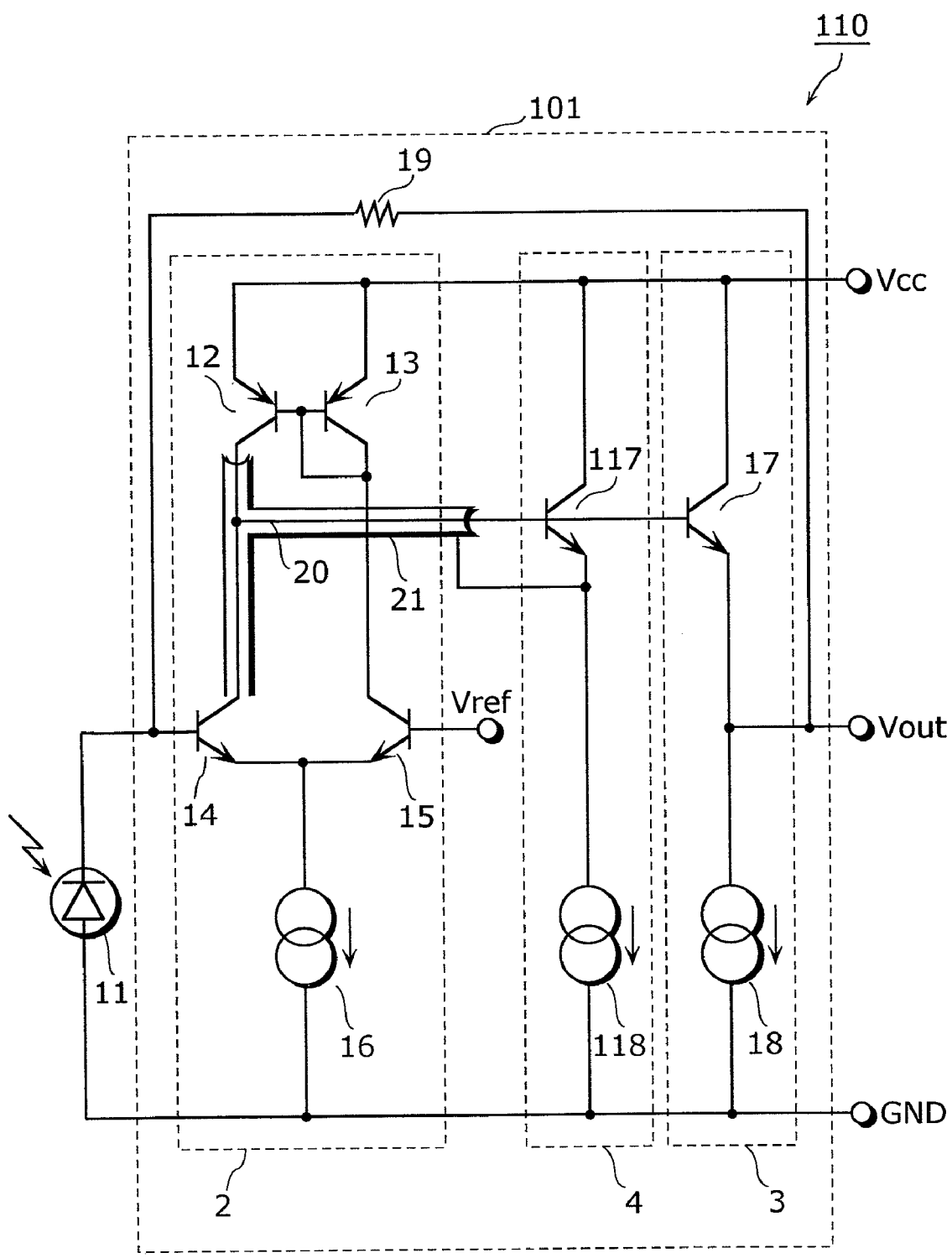
FIG. 8 is a diagram showing a configuration of a variation of the optical semiconductor device according to the first embodiment of the present invention.

FIG. 8 is a circuit diagram showing a configuration of a variation of the optical semiconductor device according to the first embodiment described above. A current-voltage conversion amplifier 101 in the optical semiconductor device 110 shown in FIG. 8 has a buffer 4 in addition to the configuration of the current-voltage conversion amplifier 1 shown in FIG. 2. The buffer 4 carries out a current amplification on the voltage of the connection wire 20 and outputs the amplified voltage to the shield wire 21. For example, the buffer 4 has an identical structure with the output stage 3 and thereby has a NPN transistor 117 and a current source 118. In the NPN transistor 117, a base is connected to the connection wire 20, a collector is connected to the power supply voltage Vcc, and an emitter is connected to the shield wire 21. The current source 118 is connected between the emitter of the NPN transistor 117 and the GND. In this manner, the influence of the parasitic capacitance from the shield wire 21 upon the output terminal Vout can be eliminated by connecting the shield wire 21 to the node whose potential is identical with the output terminal Vout in the output stage 3 or which is in phase with the output terminal Vout. Moreover, in the same manner as the optical semiconductor device 100 described above, the influence of the parasitic capacitance on the connection wire 20 can be reduced. Besides, the configuration of the buffer 4 can be different from that of the output stage 3.

The present invention is not limited to the configuration of the differential amplifier 2 and the output stage 3 shown in the above FIG. 2. Furthermore, the differential amplifier 2 and the output stage 3 are made up of bipolar transistors in FIG. 2, however, the differential amplifier 2 and the output stage 3 may also be made up of MOS transistors.

Second Embodiment

In the second embodiment of the present invention, an optical semiconductor device whose amplifier configuration in a voltage-current conversion amplifier is changed from the configuration of the first embodiment is described.

First, a configuration of the optical semiconductor device according to the second embodiment of the present invention is described.

Figure 9:
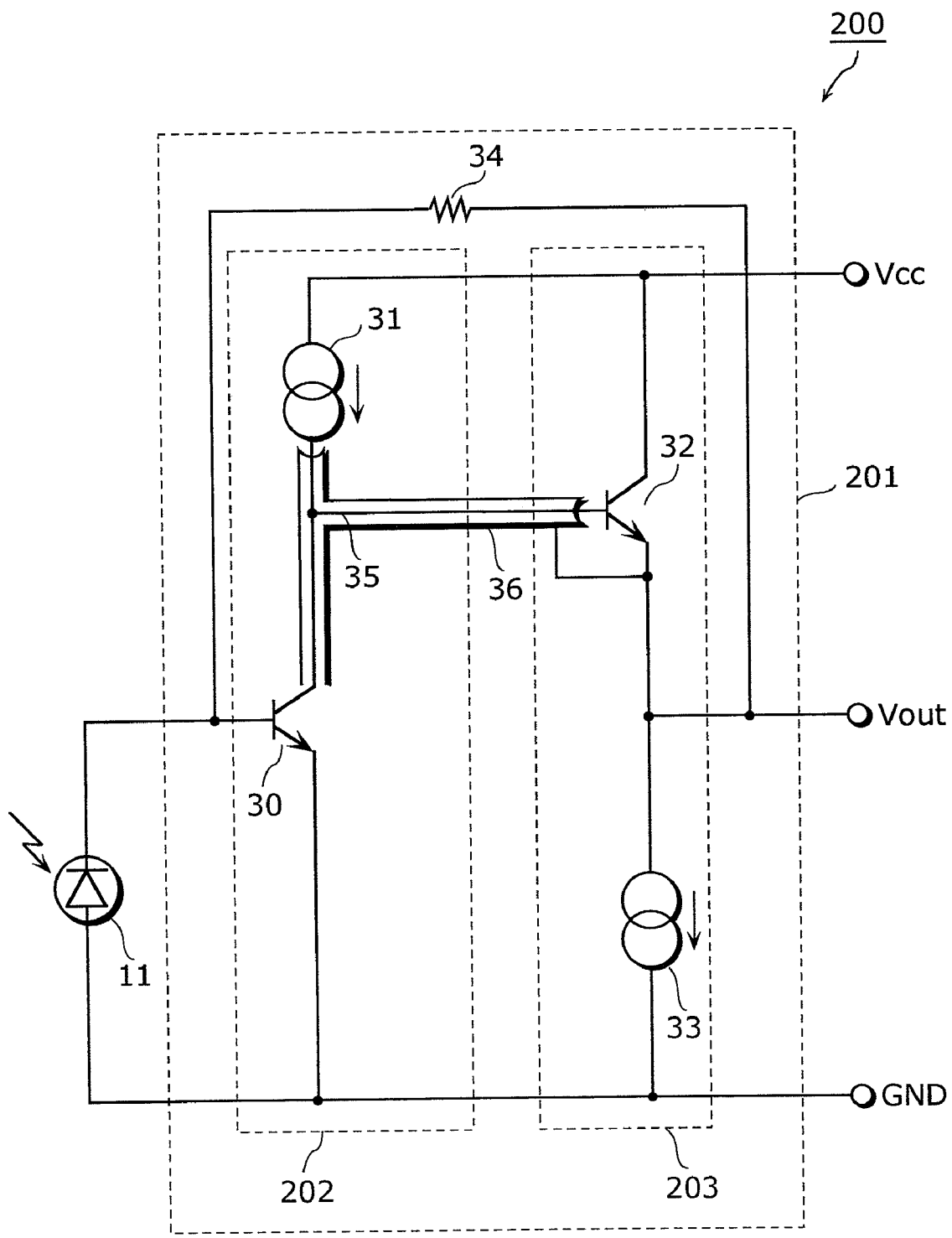
FIG. 9 is a diagram showing a configuration of an optical semiconductor device according to the second embodiment of the present invention.

FIG. 9 is a circuit diagram showing the configuration of the optical semiconductor device according to the second embodiment of the present invention. An optical semiconductor device 200 shown in FIG. 9 includes a light-receiving element 11 and a current-voltage conversion amplifier 201. In the optical semiconductor device 200, a configuration of an amplifier 202 in the current-voltage conversion amplifier 201 is different from that of the optical semiconductor device 100 shown in FIG. 2.

The light-receiving element 11 converts the light signal, with which the light-receiving element 11 is irradiated, into a current signal (photo-electric signal).

The current-voltage conversion amplifier 201 converts the current signal which is received from the light-receiving element 11 into a voltage signal and outputs the voltage signal to an output terminal Vout. The current-voltage conversion amplifier 201 includes the amplifier 202, an output stage 203, a feedback resistor 34, a connection wire 35, and a shield wire 36.

In the amplifier 202, the light-receiving element 11 is connected to an input, and an amplified signal is outputted to the connection wire 35. The amplifier 202 includes a NPN transistor 30 and a constant current source 31. In the NPN transistor 30, a base is connected to the light-receiving element 11, a collector is connected to the connection wire 35, and an emitter is connected to a GND. The constant current source 31 is connected between the connection wire 35 (the collector of the NPN transistor 30) and a power supply voltage Vcc.

The configuration of the output stage 203 is similar to the configuration of the output stage 3 in FIG. 2. In the output stage 203, the connection wire 35 is connected to an input, and the signal which is amplified by the amplifier 202 is outputted to the output terminal Vout. The output stage 203 includes a NPN transistor 32 and a constant current source 33. In the NPN transistor 32, a base is connected to the connection wire 35, a collector is connected to the power supply voltage Vcc, and an emitter is connected to the output terminal Vout. The constant current source 33 is connected between the emitter of the NPN transistor 32 and the GND.

The feedback resistor 34 is connected between the base of the NPN transistor 30, which is an input of the current-voltage conversion amplifier 201, and the output terminal Vout.

The connection wire 35 is the wire to connect an output of the amplifier 202 and the input of the output stage 203. In other words, the connection wire 35 is the wire to connect the collector of the NPN transistor 30, the constant current source 31, and the base of the NPN transistor 32.

The shield wire 36 is the wire which is connected to the emitter of the NPN transistor 32 (Vout) and is placed on a downside, both sides, and an upside of the connection wire 35.

Besides, the configurations shown in FIGS. 3 to 5 can be applied to the configurations of the connection wire 35 and the shield wire 36, in the same manner as the first embodiment.

Next, an operation of the optical semiconductor device 200 is described.

When the light-receiving element 11 is irradiated with the light signal, the light-receiving element 11 converts the light signal into a current signal and the current signal is inputted to the base of the emitter-grounded NPN transistor 30 and the feedback resistor 34. The current signal is converted into a voltage signal by the feedback resistor 34 and is outputted to the emitter of the NPN transistor 32 in the output stage 203 and the output terminal Vout.

The collector of the NPN transistor 30 is the connection wire 35 and is connected to the base of the NPN transistor 32 in the output stage 203. Thus, an output current of the NPN transistor 30 is a base current of the NPN transistor 32, and a value of the output current is 1/(1+hFE) times as large as that of an emitter current of the NPN transistor 32 (hFE indicates a current amplification factor here).

A fluctuation $\Delta IPD$ of the photo-electric current when the light-receiving element 11 is irradiated with the light signal is provided from the emitter of the NPN transistor 32, thus a fluctuation of the base current of the NPN transistor 32, that is to say, a fluctuation $\Delta Io$ of the output current of the NPN transistor 30 is expressed as:

$$\Delta Io = \Delta IPD/(1+hFE)$$

In other words, the fluctuation $\Delta Io$ of the output current is extremely a small current fluctuation, thus an impedance of the connection wire 35 becomes large. Generally, a wire which has a large impedance is susceptible to the parasitic capacitance. Consequently, when the parasitic capacitance of the connection wire 35 of the NPN transistor 30 has the large parasitic capacitance, the deterioration of the frequency characteristic occurs.

As described above, in the optical semiconductor device 200 according to the present embodiment, the shield wire 36 is placed around the connection wire 35 of the NPN transistor 30 and is connected to the emitter of the NPN transistor 32. A base potential and an emitter potential of the NPN transistor 32 generate in phase signals having a potential difference which is a base-emitter voltage VBE of the NPN transistor 32, as described in the first embodiment, so that the parasitic capacitance between the connection wire 35 of the NPN transistor 30 and the shield wire 36 is substantially negligible.

As described above, the optical semiconductor device 200 according to the second embodiment of the present invention has the shield wire 36 which is formed around the connection wire 35 of the amplifier 202 and also is connected to the output of the output stage 203. Thus, the parasitic capacitance between the semiconductor substrate and the connection wire 35 and between the other wire and the connection wire 35 can be reduced. Consequently, the deterioration of the frequency characteristic of the optical semiconductor device 200 can be reduced.

Third Embodiment

In the third embodiment of the present invention, an example that the optical semiconductor device described above is applied to an optical pickup device is described.

Figure 10:
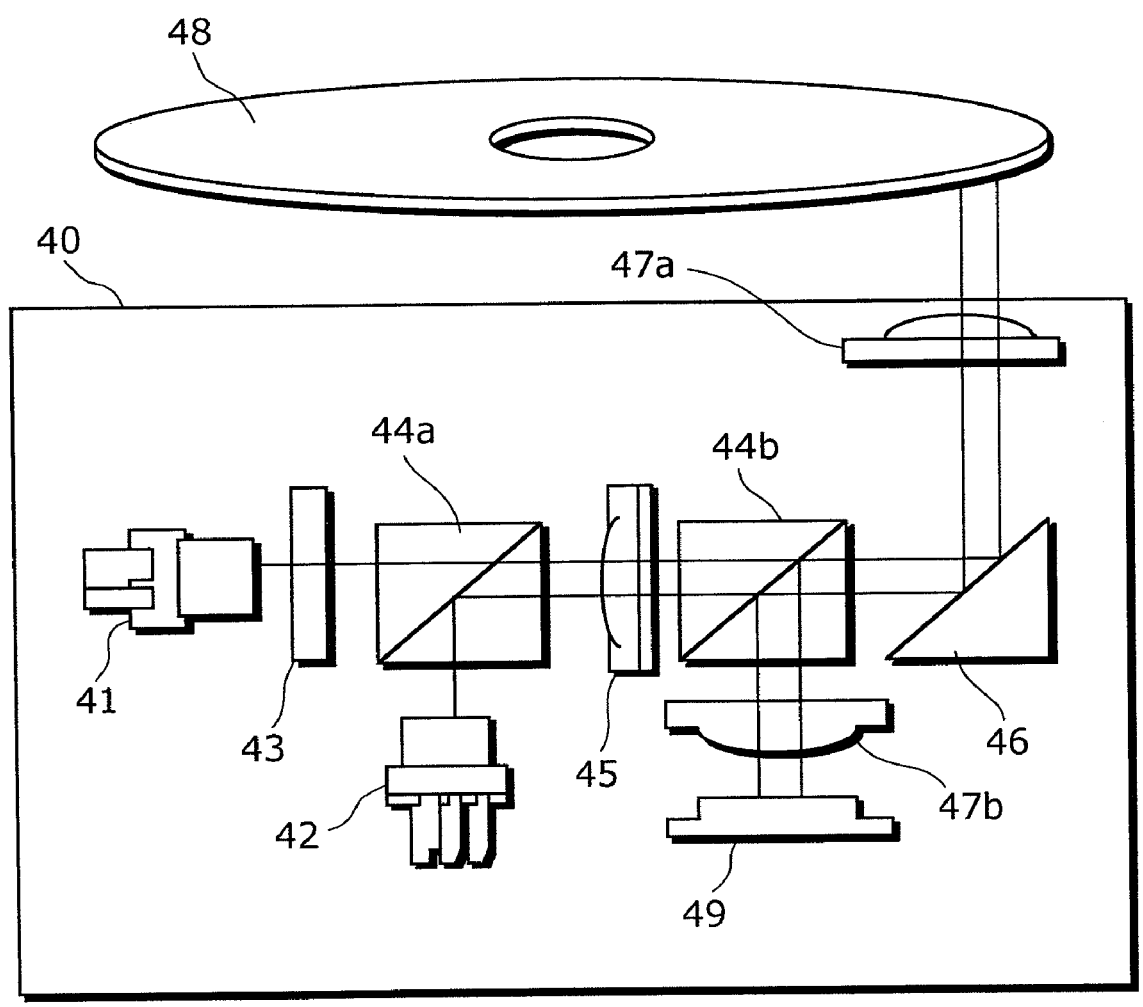
FIG. 10 is a diagram showing a configuration of an optical pickup device according to the third embodiment of the present invention.

FIG. 10 shows a configuration of the optical pickup device according to the third embodiment of the present invention.

An optical pickup device 40 shown in FIG. 10 accepts both DVD and CD. The optical pickup device 40 reads out data from an optical disk medium 48 and writes data to the optical disk medium 48. The optical pickup device 40 includes an infrared laser 41, a red laser 42, a three-beam grating 43, beam splitters 44a and 44b, a collimator lens 45, a mirror 46, objective lens 47a and 47b, and a light-receiving IC 49. The light-receiving IC 49 receives a laser light which is reflected by the optical disk medium 48. The light-receiving IC 49 includes the various optical semiconductor devices 100 according to the first embodiment shown in FIG. 2, for example.

First, an operation in accepting the CD is described. The infrared laser 41 outputs an infrared laser light. The infrared laser light which is outputted from the infrared laser 41 is divided into three beams by the three-beam grating 43. The divided infrared laser light passes through the beam splitter 44a, the collimator lens 45, and the beam splitter 44b in sequence, and is reflected by the mirror 46 and then enters the objective lens 47a. The light which is gathered by the objective lens 47a enters the optical disk medium 48 (CD). The infrared laser light which enters the optical disk medium 48 is reflected by the optical disk medium 48, and then passes through the objective lens 47a, the mirror 46, and the beam splitter 44b in sequence. Subsequently, the reflected light is refracted by the beam splitter 44b and then passes through the objective lens 47b, so that an acceptance surface of the light-receiving IC 49 is irradiated with the reflected light.

In the light reflected and returned from the optical disk medium 48, pit data and so on which are on the disk surface are included. The light-receiving IC 49 obtains a data signal from the optical disk medium 48, a focus error signal, a tracking error signal and so on by receiving the light reflected and returned from the optical disk medium 48 and carrying out an arithmetic processing on a photo-electric current which is generated in a light-receiving element. In particular, the respective lights reflected and returned from the optical disk medium 48 are converted into the photo-electric currents in the plural light-receiving elements 11 for the CD in the light-receiving IC 49 and are converted into voltages in the respective current-voltage conversion amplifiers 1 and are subsequently outputted. The converted voltage is outputted as the focus error signal, for example. The respective signals which are converted into the voltage in the plural current-voltage conversion amplifiers 1 are arithmetically processed by an arithmetic circuit or the like (not shown), which is included in the light-receiving IC 49, and are subsequently outputted. The signals which are outputted from the light-receiving IC 49 are used for writing data, controlling a position of the optical pickup device and so on.

Next, an operation in accepting the DVD is described. The red laser which is outputted from the red laser 42 passes through the beam splitter 44a, the collimator lens 45, and the beam splitter 44b in sequence, and is reflected by the mirror 46 and then enters the objective lens 47a. The light which is gathered by the objective lens 47a enters the optical disk medium 48 (DVD) and is subsequently reflected by the optical disk medium 48, and then passes through the objective lens 47a, the mirror 46, and the beam splitter 44b in sequence. Subsequently, the reflected light is refracted by the beam splitter 44b and then passes through the objective lens 47b, so that the acceptance surface of the light-receiving IC 49 is irradiated with the reflected light.

The respective lights reflected and returned from the optical disk medium 48 is converted into the photo-electric currents in the plural light-receiving elements 11 for the DVD in the light-receiving IC 49 and are converted into voltages in the respective current-voltage conversion amplifiers 1 and are subsequently outputted. Each converted voltage is outputted as the focus error signal, for example. The respective signals which are converted into the voltage in the plural current-voltage conversion amplifiers 1 are arithmetically processed by an arithmetic circuit or the like (not shown), which is included in the light-receiving IC 49, and are subsequently outputted. The signals which are outputted from the light-receiving IC 49 are used for writing data, controlling a position of the optical pickup device and so on. While the laser light is divided into the three beams when accepting the CD, the laser light is not divided but becomes the one beam when accepting the DVD. Thus, on the acceptance surface, a position which is irradiated with the returned light when accepting the CD is different from that when accepting the DVD. Moreover, the laser lights which are outputted from the infrared laser 41 and the red laser 42 are adjusted to have substantially the same light axis in a light path from the beam splitter 44a to the optical disk medium 48 and in a light path from the optical disk medium 48 to the light-receiving IC 49, respectively. Consequently, the same optical device and the same receiving system can be used, so that a miniaturization of the optical pickup device and an adjustment during an assembly process can easily be achieved.

As described above, with regard to the optical pickup device 40 according to the third embodiment of the present invention, in the current-voltage conversion amplifier 1 in the optical semiconductor device 100 which is mounted on the light-receiving IC 49, the shield wire 21 which is connected to the output of the output stage 3 is formed around the connection wire 20 in differential amplifier 2. This configuration can reduce the parasitic capacitance between the semiconductor substrate 22 and the connection wire 20 and between the other wire and the connection wire 20. Thus, the deterioration of the frequency characteristic of the optical semiconductor device 100 can be prevented. That is to say, the optical pickup device 40 can prevent the deterioration of the frequency characteristic in a photo-electric conversion of a reflected light from a DVD, in which a high-frequency band is used, and so on and in an amplification of the converted electric signal.

Regarding the structures of the laser, the light-receiving IC and so on and the positional relationship of the respective components, the present invention is not limited to the configuration described above, however, any modification can be appropriately applied, depending on the layout. For example, the light-receiving element, the amplifier circuit, and the arithmetic circuit can be formed in separate IC chips, respectively.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention can be applied to an optical pickup device, which is used for an optical disk reproducing and recording device to store and reproduce data in an optical disk (such as CD, DVD, BD, HD-DVD, or the like), and an optical semiconductor device, which is used for the optical pickup device.

What is claimed is:

1. An optical semiconductor device comprising:
   a light-receiving element which converts light into an electric signal;
   an amplifier circuit having an input to which said light-receiving element is connected, and which amplifies the electric signal;
   a connection wire to which the signal amplified by said amplifier circuit is outputted;
   an output circuit having an input to which said connection wire is connected, and which performs current amplification on the signal amplified by said amplifier circuit and outputs the current-amplified signal to an output terminal;
   a feedback resistor connected between the input of said amplifier circuit and the output terminal; and
   a shield wire connected to a potential outputted from said output circuit or a potential resulting from a voltage follower of the potential outputted from said output circuit,
   wherein the potential connected to the shield wire is in phase with the signal outputted to the connection wire.

2. The optical semiconductor device according to claim 1, wherein said amplifier circuit, said connection wire, and said output circuit are formed on a semiconductor substrate, and said shield wire is formed on a side of said connection wire facing said semiconductor substrate.

3. The optical semiconductor device according to claim 2, wherein said shield wire is made of a metal layer, a polysilicon layer, or a diffusion layer, below said connection wire.

4. The optical semiconductor device according to claim 1, wherein said output circuit includes:

a first output circuit which performs current amplification on the signal amplified by said amplifier circuit and outputs the current-amplified signal to the output terminal; and
a second output circuit which performs current amplification on the signal amplified by said amplifier circuit and outputs the current-amplified signal to said shield wire, and
said shield wire is connected to a potential outputted by said second output circuit.

5. The optical semiconductor device according to claim 1, wherein said amplifier circuit includes:
   a first transistor in which a control terminal is connected to said light-receiving element, and a first output terminal is connected to said connection wire;
   a second transistor in which a control terminal is connected to a reference voltage, and a second output terminal is connected to a second output terminal of said first transistor;
   a third transistor in which a control terminal is connected to a first output terminal of said second transistor, a first output terminal is connected to said connection wire, and a second output terminal is connected to a power supply voltage;
   a fourth transistor in which a control terminal and a first output terminal is connected to the first output terminal of said second transistor and a second output terminal is connected to a power supply voltage; and
   a first current source connected between the second output terminal of said first transistor and said second transistor and a ground.

6. An optical pickup device performing at least one of operations including reading of data from an optical disk medium and writing of data to an optical disk medium, said optical pickup device comprising:
   a laser beam generating unit operable to irradiate the optical disk medium with a laser beam; and
   an optical semiconductor device which receives the laser beam radiated by said laser beam generating unit and reflected by the optical disk medium,
   wherein said optical semiconductor device includes:
   a light-receiving element which converts light into an electric signal;
   an amplifier circuit having an input to which said light-receiving element is connected, and which amplifies the electric signal;
   a connection wire to which the signal amplified by said amplifier circuit is outputted;
   an output circuit having an input to which said connection wire is connected, which performs current amplification on the signal amplified by said amplifier circuit and outputs the current-amplified signal to an output terminal;
   a feedback resistor connected between the input of said amplifier circuit and the output terminal; and
   a shield wire connected to a potential outputted from said output circuit or a potential resulting from a voltage follower of the potential outputted from said output circuit,
   wherein the potential connected to the shield wire is in phase with the signal outputted to the connection wire.

* * * * *